(12) United States Patent
Sawanami

(10) Patent No.: US 10,939,518 B2
(45) Date of Patent: Mar. 2, 2021

(54) COMPONENT-MOUNTING MACHINE AND METHOD FOR ADJUSTING ILLUMINATION LIGHT AMOUNT THEREOF

(71) Applicant: FUJI CORPORATION, Chiryu (JP)

(72) Inventor: Hisato Sawanami, Kariya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/628,927

(22) PCT Filed: Jul. 18, 2017

(86) PCT No.: PCT/JP2017/025887
§ 371 (c)(1),
(2) Date: Jan. 6, 2020

(87) PCT Pub. No.: WO2019/016848
PCT Pub. Date: Jan. 24, 2019

(65) Prior Publication Data
US 2020/0221551 A1 Jul. 9, 2020

(51) Int. Cl.
*H05B 45/14* (2020.01)
*H05K 13/08* (2006.01)
(Continued)

(52) U.S. Cl.
CPC ........... *H05B 45/14* (2020.01); *H04N 5/2354* (2013.01); *H05B 45/325* (2020.01); *H05K 13/0812* (2018.08)

(58) Field of Classification Search
CPC ...... H05B 45/10; H05B 45/14; H05B 45/325; H05K 13/081; H05K 13/0812; H04N 5/2354
See application file for complete search history.

(56) References Cited

U.S. PATENT DOCUMENTS 9,131,575 B2 9/2015 Kawasaki
2004/0246367 A1 12/2004 Yoshida
(Continued)

FOREIGN PATENT DOCUMENTS

CN 103185726 A 7/2013
JP 5-332939 A 12/1993
(Continued)

OTHER PUBLICATIONS

International Search Report dated Oct. 24, 2017 in PCT/JP2017/025887 filed Jul. 18, 2017, 2 pages.

*Primary Examiner* — Amy Cohen Johnson
*Assistant Examiner* — Syed M Kaiser
(74) *Attorney, Agent, or Firm* — Oblon, McClelland, Maier & Neustadt, L.L.P.

(57) ABSTRACT

A component-mounting machine including an LED lighting device configured to illuminate an imaging target that is to be imaged by a camera loaded on the component-mounting machine; and an illumination light amount adjusting device configured to adjust in steps with a specified gradation quantity an illumination light amount of the LED lighting device. The LED lighting device uses two types of LED elements with different brightness levels, and the illumination light amount adjusting device is configured to adjust in steps with a specified gradation quantity a pulse width or a current value of a current flowing through low-brightness LED elements that are the LED elements with a lower brightness level out of the two types of LED elements so as to adjust in steps with a specified gradation quantity an emitted light amount of the low-brightness LED elements while maintaining a specified level of illumination light amount.

7 Claims, 7 Drawing Sheets

(51) Int. Cl.
*H04N 5/235* (2006.01)
*H05B 45/325* (2020.01)

(56) References Cited

U.S. PATENT DOCUMENTS

| | | | | |
|---|---|---|---|---|
| 2005/0265014 A1* | 12/2005 | Matsui | ........... | H04N 5/2256 |
| | | | | 362/5 |
| 2011/0121744 A1* | 5/2011 | Salvestrini | ........ | H02M 5/2576 |
| | | | | 315/246 |
| 2013/0020955 A1* | 1/2013 | Igaki | ........... | F21S 8/04 |
| | | | | 315/201 |
| 2013/0169793 A1 | 7/2013 | Hayashi et al. | | |
| 2013/0169795 A1 | 7/2013 | Hayashi et al. | | |
| 2013/0255057 A1* | 10/2013 | Komatsu | ........ | H05K 13/041 |
| | | | | 29/428 |
| 2014/0333223 A1* | 11/2014 | Trinschek | ...... | H05B 45/10 |
| | | | | 315/210 |
| 2014/0339985 A1* | 11/2014 | Engelen | ........ | G06F 3/0421 |
| | | | | 315/151 |
| 2015/0222794 A1* | 8/2015 | Yamakage | ...... | H05K 13/0812 |
| | | | | 348/360 |
| 2016/0219761 A1* | 7/2016 | Nishiyama | ........ | H05K 13/0404 |
| 2016/0338168 A1* | 11/2016 | Rantala | ........... | A01G 9/20 |
| 2016/0374177 A1* | 12/2016 | Chen | ........... | H05B 47/19 |
| 2017/0018231 A1* | 1/2017 | Liu | ........... | G09G 3/3426 |
| 2017/0064883 A1* | 3/2017 | Kawai | ........... | H05K 13/041 |
| 2017/0094743 A1* | 3/2017 | Chen | ........... | H05B 45/37 |
| 2017/0252880 A1* | 9/2017 | Okada | ........... | G06T 7/0008 |
| 2018/0368298 A1* | 12/2018 | Kawai | ........... | H05K 13/087 |
| 2019/0101252 A1* | 4/2019 | Renders | ........... | H05B 47/155 |
| 2019/0147710 A1* | 5/2019 | Carley | ........... | G08B 5/38 |
| | | | | 340/815.45 |

FOREIGN PATENT DOCUMENTS

| | | |
|---|---|---|
| JP | 9-42929 A | 2/1997 |
| JP | 11-224784 A | 8/1999 |
| JP | 2000-124683 A | 4/2000 |
| JP | 2003-174292 A | 6/2003 |
| JP | 2003174292 A * | 6/2003 |
| JP | 2005-3385 A | 1/2005 |
| JP | 2006-59981 A | 3/2006 |
| JP | 2014-102352 A | 6/2014 |
| WO | WO 2015/001633 A1 | 1/2015 |

\* cited by examiner

COMPONENT-MOUNTING MACHINE AND METHOD FOR ADJUSTING ILLUMINATION LIGHT AMOUNT THEREOF

TECHNICAL FIELD

The present specification discloses technology related to a component-mounting machine having a function of adjusting in steps with a specified gradation quantity an illumination light amount of an LED lighting device for illuminating an imaging target imaged by a camera, and an illumination light amount adjusting method thereof.

BACKGROUND ART

Conventionally, an LED lighting device for a camera mounted on a component-mounting machine is configured by using multiple LED elements, makes use of a characteristic in which the amount of light emitted from each LED element increases or decreases substantially in proportion to the value of current flowing to each LED element, and adjusts the amount of light emitted from each LED element by adjusting the value of current flowing to each LED element with an LED driver (LED drive circuit), thereby adjusting the illumination light amount that illuminates the imaging target.

Since the illumination light amount of the LED lighting device is adjusted by a control device (computer) of the component-mounting machine using a digital signal, adjustment of the current value of the LED elements by the LED drivers is adjustment in steps, for example, 64-step gradation or 128-step gradation. Here, the greater the quantity of steps in the gradation, the finer the adjustment width (adjustment width of the light amount) of the current value per gradation step, which has the advantage of being able to finely adjust the illumination amount in accordance with the imaging target, the imaging environment, or the like, but has the disadvantage that the higher the gradation level of the LED drivers, the more costs increase.

Further, an LED lighting device disclosed in patent literature 1 (JP-A-2003-174292), in order to increase the gradation quantity for adjusting the illumination light amount in steps, performs light amount adjustment of m levels for each individual LED element for a group consisting of a total of n LED elements, and is thus able to perform adjustment of the illumination light amount of n×m levels (gradations) for the group as a whole.

CITATION LIST

Patent Literature

Patent Literature 1: JP-A-2003-174292

BRIEF SUMMARY

Technical Problem

However, as described in patent literature 1, in order to individually adjust the amount of light for each LED element, it is necessary to provide one LED driver for each LED element. This configuration requires the same quantity of LED drivers as there are LED elements, which increases cost.

Further, in a case in which the illumination light amount for illuminating an imaging target is increased, the quantity of LED elements must be increased, or the LED elements must be changed to high-brightness LEDs (high-output LEDs). However, if the quantity of LED elements is increased, the mounting area on which the LED elements are mounted must be increased, leading to a disadvantage of the LED lighting device becoming larger. Also, since the space in which to arrange the LED lighting device is small around the camera loaded on the component-mounting machine (in particular, a camera for imaging components held by a suction nozzle from the side), there are cases in which it is difficult to make the LED lighting device larger.

On the other hand, if the LED elements are changed to high-brightness LEDs, there is a drawback that the adjustment width of the current value (adjustment width of the light amount) per gradation, which is adjusted by the LED driver, becomes coarse, and the illumination light amount for illuminating the imaging target cannot be finely adjusted.

In short, conventional LED lighting devices mounted on a component-mounting machine are unable to simultaneously handle an increase of the illumination light amount and a finer subdivision of the adjustment width while satisfying the demand to reduce costs and make the device more compact.

Solution to Problem

To solve the above problems, disclosed herein is a component-mounting machine including: an LED lighting device configured to illuminate an imaging target that is to be imaged by a camera loaded on the component-mounting machine; and an illumination light amount adjusting device configured to adjust in steps with a specified gradation quantity an illumination light amount of the LED lighting device, wherein the LED lighting device uses two types of LED elements with different brightness levels, and the illumination light amount adjusting device is configured to adjust in steps with a specified gradation quantity a pulse width or a current value of a current flowing through low-brightness LED elements that are the LED elements with a lower brightness level out of the two types of LED elements so as to adjust in steps with a specified gradation quantity an emitted light amount of the low-brightness LED elements while maintaining a specified level of illumination light amount by making a specified current flow through high-brightness LED elements that are the LED elements with a higher brightness level out of the two types of LED elements, in order to adjust the illumination light amount in steps with the specified gradation quantity in a region that exceeds the specified level while maintaining a required illumination light amount required for imaging the imaging target.

Generally, the amount of illumination light suitable for imaging an imaging target depends on the type of the imaging target, the performance of the camera, and the like, but in any case, it does not matter how finely the amount of illumination light amount can be adjusted in an area equal to or less than the minimum amount of light required for imaging the imaging target, meaning there is no need to adjust the amount of light.

Therefore, the LED lighting device is configured using high-brightness LED elements and low-brightness LED elements, and the current flowing through the low-brightness LED elements is adjusted in steps with the specified gradation while a specified level of illumination light amount is maintained (for example, a light amount level that is the minimum required for imaging of the imaging target, or a light amount level slightly lower than that) by making a specified current flow through the high-brightness LED elements, such that the illumination light amount is adjusted in the specified gradation quantity in a region that exceeds the specified level while the illumination light amount required for imaging the imaging target is maintained. In this manner, since the illumination light amount can be adjusted by the specified gradation quantity in a region exceeding the specified level that is a region for which light amount adjustment is required, the illumination light amount can be finely adjusted in a region in which the light amount adjustment is necessary. Further, by using high-brightness LED elements, the illumination light amount can be easily increased without increasing the quantity of LED elements, and increases in the illumination light amount can be handled while satisfying the demand to make the device compact.

DESCRIPTION OF EMBODIMENTS

Figure 1:
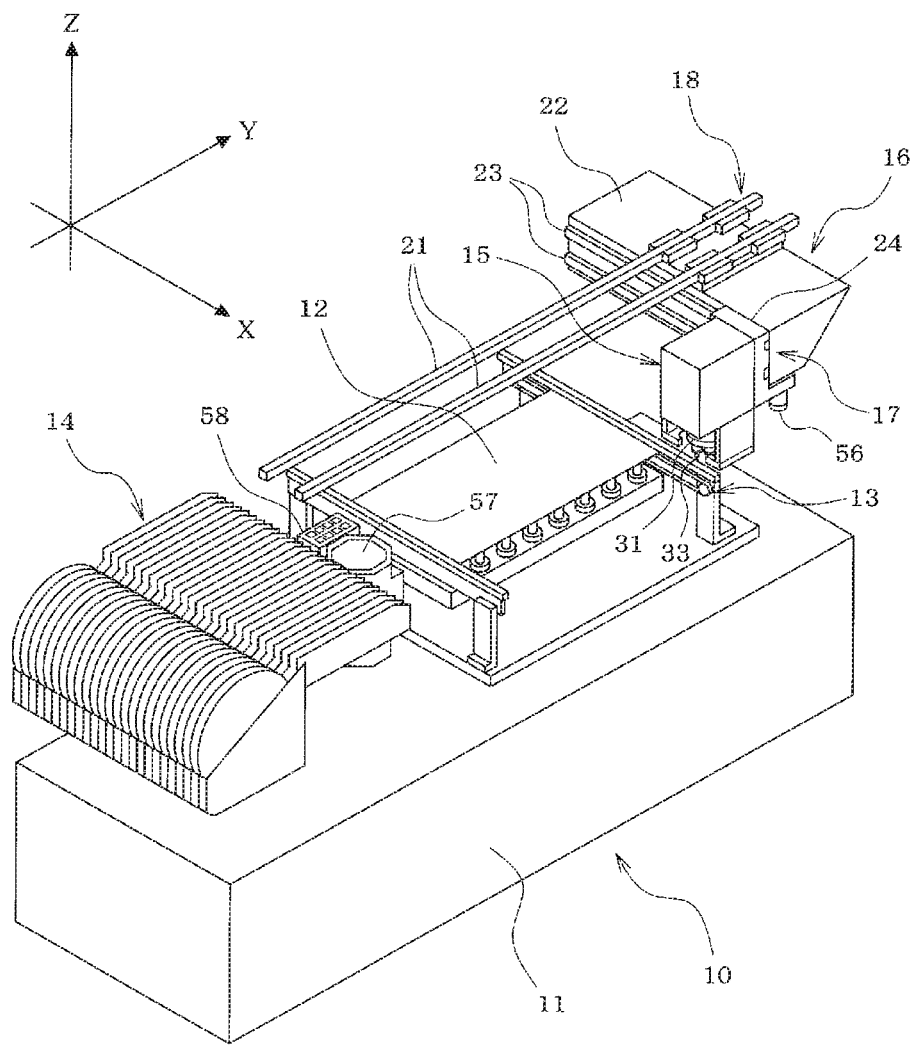
FIG. 1 is a perspective view showing a configuration of a main part of a component-mounting machine according to an embodiment.

An embodiment is described below.

First, the configuration of the component-mounting machine 10 will be described with reference to FIG. 1. Conveyor 13 that conveys circuit board 12 is provided on base 11 of the component-mounting machine 10 (below, the conveyance direction of circuit board 12 by conveyor 13 is referred to as the X direction, and the direction perpendicular to that is referred to as the Y direction). Component supply devices 14 such as a tape feeder or a tray feeder are installed to the side of conveyor 13 on base 11, and components to be mounted on circuit board 12 are supplied by the component supply devices 14.

Component-mounting machine 10 is provided with head moving device 16 for moving rotary-type mounting head unit 15 in horizontal directions (XY directions). Head moving device 16 is configured from X-axis slide mechanism 17 for moving mounting head unit 15 in the X direction, and Y-axis slide mechanism 18 for moving mounting head unit 15 in the Y direction. Y-axis slide mechanism 18 is configured such that two Y-axis guide rails 21 are fixed to an upper section of component-mounting machine 10 so as to extend parallel to the Y direction, and Y-axis slide 22 slidably supported by the Y-axis guide rails 21 is moved in the Y direction by a ball screw device (not shown) or the like whose drive source is a Y-axis motor (not shown). On the other hand, in X-axis slide mechanism 17, two X-axis guide rails 23 are attached to Y-axis slide 22 so as to extend parallel to the X direction, X-axis slide 24 is slidably supported by the X-axis guide rails 23, and X-axis slide mechanism 24 is moved in the X direction by a ball screw device (not shown) or the like having an X-axis motor as a drive source, thereby moving the mounting head unit 15 attached to the X-axis slide mechanism 24 in the X direction.

Figure 2:
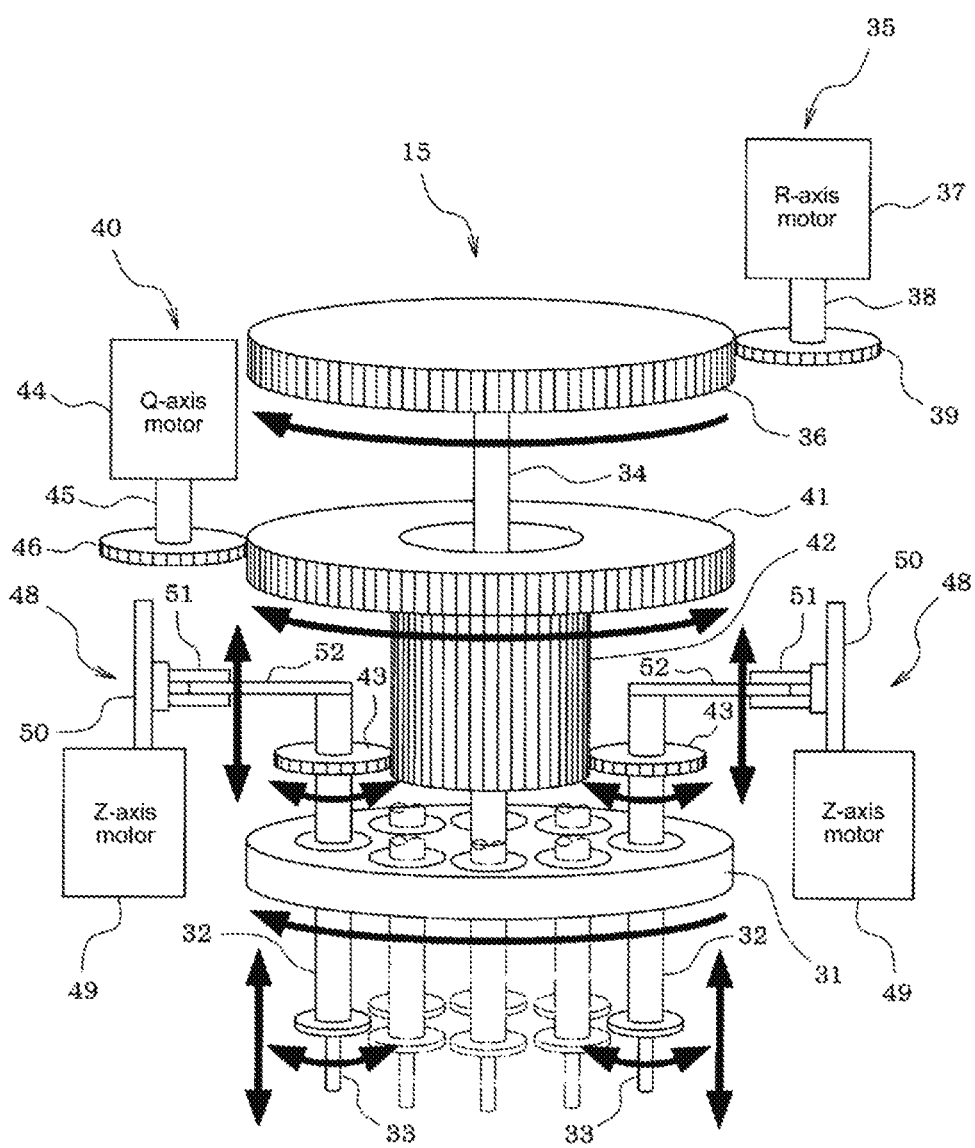
FIG. 2 is a perspective view illustrating the configuration of a rotary-type mounting head unit.

Next, the configuration of rotary-type mounting head unit 15 will be described with reference to FIG. 2. Multiple nozzle holders 32 are supported on rotary head 31 (mounting head), which is provided in mounting head unit 15, at specified interval intervals in a circumferential direction so as to be lowerable, and a suction nozzle 33 for picking up components supplied from component supply device 14 is held in each nozzle holder 32 in an exchangeable manner pointing in a downward direction.

Rotation head 31 is engaged with a lower end of R-axis 34 extending in the vertical direction (Z direction), and R-axis gear 36 of R-axis drive mechanism 35 is engaged with an upper end of R axis 34. R-axis gear 36 engages with gear 39 fixed to rotation shaft 38 of R-axis motor 37 such that R-axis gear 36 is rotated by the rotation of gear 39 of R-axis motor 37, so that rotation head 31 rotates around R-axis 34, whereby the multiple nozzle holders 32 rotate (revolve) integrally with the multiple suction nozzles 33 in the circumferential direction of head 31.

Q-axis gears 28 and 29 provided at two levels in the vertical direction of Q-axis drive mechanism 27 are rotatably inserted into R axis 34 and gear 43 that engaged with an upper end of each nozzle holder 12 engages with lower level Q-axis gear 42. On the other hand, gear 46 fixed to rotation shaft 45 of Q-axis motor 44 engages with upper level Q-axis gear 41, and Q-axis gears 41 and 42 integrally rotate by the rotation of gear 46 of Q-axis motor 44 to rotate each gear 43, and each nozzle holder 32 rotates around its own center axis, thereby correcting the direction (angle) of each component held by each suction nozzle 33 attached to each nozzle holder 32.

Further, Z-axis drive mechanisms 48 for individually lowering a nozzle holder 32 are provided at two positions on opposite sides of rotary head 31 in a diameter direction, such that respective nozzle holders 32 are individually lowered by each Z-axis drive mechanism 48 at two stopping positions provided at opposite sides in a diameter direction on the revolving path of nozzle holders 32. In this embodiment, the positions of the two Z-axis drive mechanisms 48 are 0° and 180°, or 90° and 270° based on the rotational angles of rotation head 31. Here, 0° and 180° are in the X direction (the board conveyance direction) and the opposite direction, and 90° and 270° are in the Y direction (the direction perpendicular to the board conveyance direction) and the opposite direction.

Each Z-axis drive mechanism 48 uses Z-axis motor 49 as an actuator, and Z-axis motor 49 rotates feed screw 50 to move Z-axis slide 51 vertically, thereby engaging Z-axis slide 51 with engaging piece 52 provided at an upper end of nozzle holder 32 to move the nozzle holder 32 up and down. Note that, Z-axis slide 51 may be moved up and down by a linear motor acting as Z-axis motor 49. Alternatively, instead of a linear motor, a linear solenoid, an air cylinder, or the like may be used.

Mounting head unit 15 configured as described above is provided with side surface imaging camera 55 (refer to FIG. 3) for capturing a side image of a component held by suction nozzle 33 or a side image of at least a lower end portion of suction nozzle 33. Further, mark imaging camera 56 (see FIG. 1) for imaging reference position marks of circuit board 12 is attached to X-axis slide 24 to which mounting head unit 15 is attached so as to face downwards, and side surface imaging camera 55 and mark imaging camera 56 are moved together with mounting head unit 15 in the X and Y directions by head moving device 16.

In addition, as shown in FIG. 1, provided in the space between component supply device 14 and conveyor 13 of base 11 of component-mounting machine 10 are: component imaging camera 57 for capturing an image of a component held by suction nozzle 33 from below; and nozzle changer 58 for storing exchange-use suction nozzles to be exchange with suction nozzles 33 held by nozzle holders 32 of mounting head unit 15.

A lighting device for illuminating an imaging target is provided on each of side surface imaging camera 55, mark imaging camera 56, and component imaging camera 57. The configuration of LED lighting device 61 that illuminates an imaging target to be imaged by side surface imaging camera 55 is described below with reference to FIGS. 3 and 4.

Figure 3:
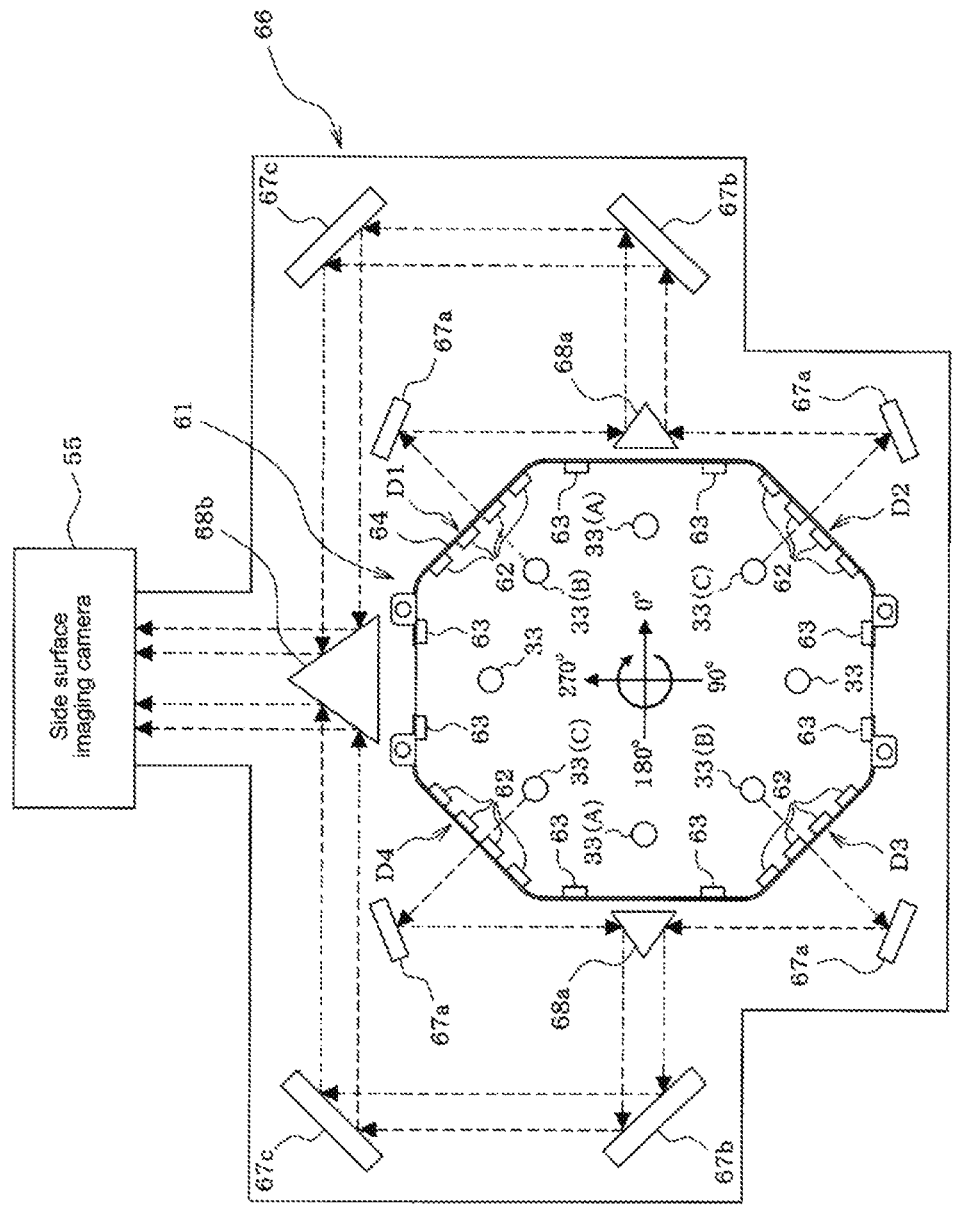
FIG. 3 is a plan view illustrating the positional relation between the LED lighting device, the suction nozzles, the optical unit, and the side surface imaging camera.

LED lighting device 61 is configured by mounting two types of LED elements, 62 and 63, that differ in brightness (amount of emitted light) on LED board 64. Hereinafter, of the two types of LED elements, 62 and 63, LED element 62 having the lower brightness is referred to as low-brightness LED element 62, and LED element 63 having the higher brightness is referred to as high-brightness LED element 63. In the present embodiment, as shown in FIG. 2, two Z-axis drive mechanisms 48 provided at two positions in the diameter direction of rotary head 31 individually lower respective suction nozzles 33 for component pickup and mounting operation at two stopping positions in the diameter direction of the revolving path of suction nozzles 33. In descriptions below, as an example, as shown in FIG. 3, a configuration is described in which the quantity of suction nozzles 33 (the quantity of nozzle holders 32) is eight, suction nozzles 33 (nozzle holders 32) are arranged at 45° pitches, and the positions at 0° and 180° based on the rotation angle of rotation head 31 are stopping positions, however, it goes without saying that the quantity of suction nozzles 33 (nozzle holders 32) and the stopping positions may be changed as appropriate. Note that, the revolving direction of the eight suction nozzles 33 shown in FIG. 3 (rotation direction of rotation head 31) is a clockwise direction.

Of the eight suction nozzles 33 held by rotation head 31, at least the lower end portions of the two suction nozzles 33 (B, C) located on both sides of the suction nozzle 33 (A) that is lowered for component pickup or mounting operation at the two stopping positions (0° and 180°), or the component held by those suction nozzles, are taken as an imaging target, and the respective imaging targets are imaged from the side by side surface imaging camera 55. Accordingly, based on the rotation angle of rotation head 31, there are four imaging positions at positions of 45°, 135°, 225°, and 315°. In other words, a side image of at least the lower end portion of the suction nozzle 33 (B) stopped at the positions of 315° and 135° one pitch ahead of the position (0° and 180°) at which the component pickup operation is performed is captured by the side image capturing camera 55, and it is confirmed by image processing that there is no component being held by the suction nozzle 33 (B) (the previous component did not remain stuck to the suction nozzle); moreover, a side image of the component held by the suction nozzle 33 (C) stopped at the positions of 45° and 225° one pitch after the position (0° and 180°) at which the component pickup operation is performed is captured by side image capturing camera 55, and the presence of the component held by the suction nozzle 33 (C), the component pickup state, and the like are checked by image processing.

To capture a side surface image of these four imaging targets with a single side surface imaging camera 55, optical unit 66 is provided to surround LED lighting device 61. Optical unit 66 is configured by combining multiple mirrors, 67a, 67b, and 67c, and multiple prisms, 68a and 68b, and reflects or refracts the side surface images of the imaging targets at the four positions along the following path: mirror 67a→prism 68a→mirror 67b→mirror 67c→prism 68b, to form a combined image on the light-receiving surface of side surface imaging camera 55. Here, so that the side surface images of the imaging targets at the four positions do not overlap each other when the image is formed on the light-receiving surface of side surface imaging camera 55, the single image captured by side surface imaging camera 55 is divided into side surface images of the imaging targets at the four positions. As a result, it is possible to simultaneously check the side surface images of the imaging targets at the four positions using one image captured by side image capturing camera 55.

Note that, optical unit 66 may be provided with an optical path switching device (not shown) or the like for selectively switching between the four optical paths for capturing side surface images of the four imaging targets, and the side surface images of the four imaging targets may be captured by the side surface imaging camera 55 one by one or two by two by switching between the optical paths.

On the other hand, as shown in FIG. 3, LED board 64 on which the low-brightness LED elements 62 and the high-brightness LED elements 63 are mounted is formed of, for example, one flexible print board, bent into an octagonal ring shape so as to surround the revolving path of the eight suction nozzles 33 held by rotation head 31, and optical unit 66 is provided so as to surround the periphery of the octagonal ring-shaped LED board 64.

Figure 4:
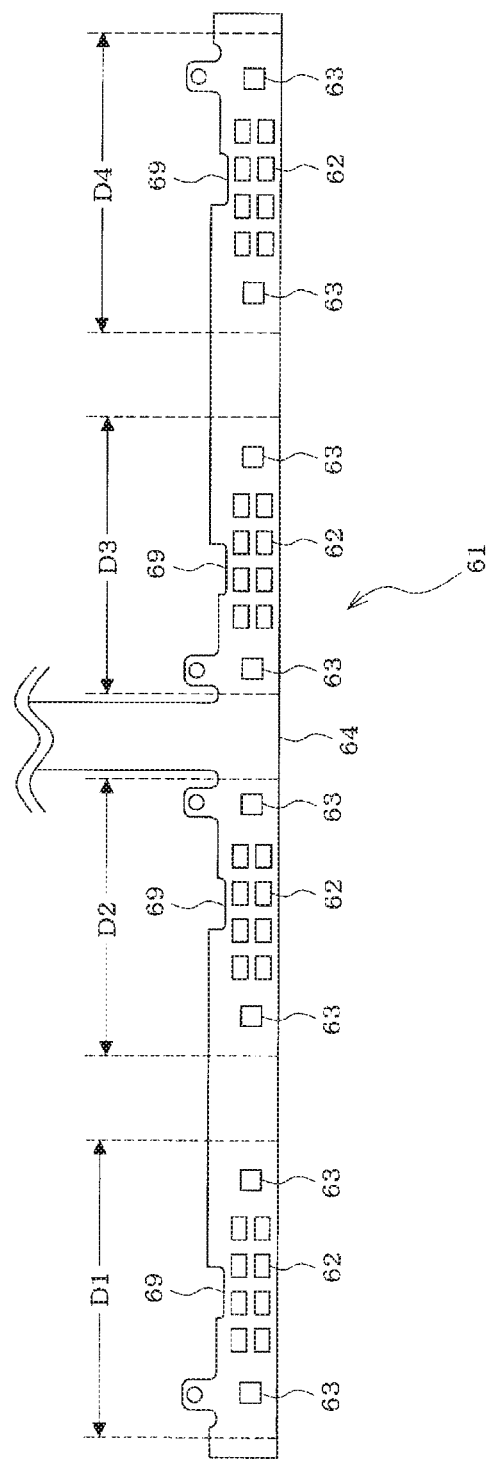
FIG. 4 is an expanded view of an LED board, on which low-brightness LED elements and high-brightness LED elements are mounted, of an LED lighting device.

In the present embodiment, as shown in FIG. 4, the LED mounting surface of LED board 64 is divided into four illumination light output areas, D1 to D4, so as to illuminate the above-mentioned four imaging targets from the sides, respectively, and low-brightness LED elements 62 and high-brightness LED elements 63 are mounted in each of the illumination light output areas D1 to D4. The quantity of the low-brightness LED elements 62 mounted on each of the illumination light output areas D1 to D4 is larger than the quantity of high-brightness LED elements 63, multiple low-brightness LED elements 62 are arranged in a center side section of each of the illumination light output areas D1 to D4, and at least one high-brightness LED element 63 is arranged on each of both sides of the low-brightness LED elements 62. In the present embodiment, the quantity of LED elements 62 and 63 in each of the illumination light output areas D1 to D4 is eight low-brightness LED elements 62 and two high-brightness LED elements 63. At the center of an upper edge of each of the illumination light output areas D1 to D4 of LED board 64, cutout section 69 (refer to FIG. 4) for guiding the side surface images of each of the imaging targets to mirror 67a of optical unit 66 is formed.

Figure 6:
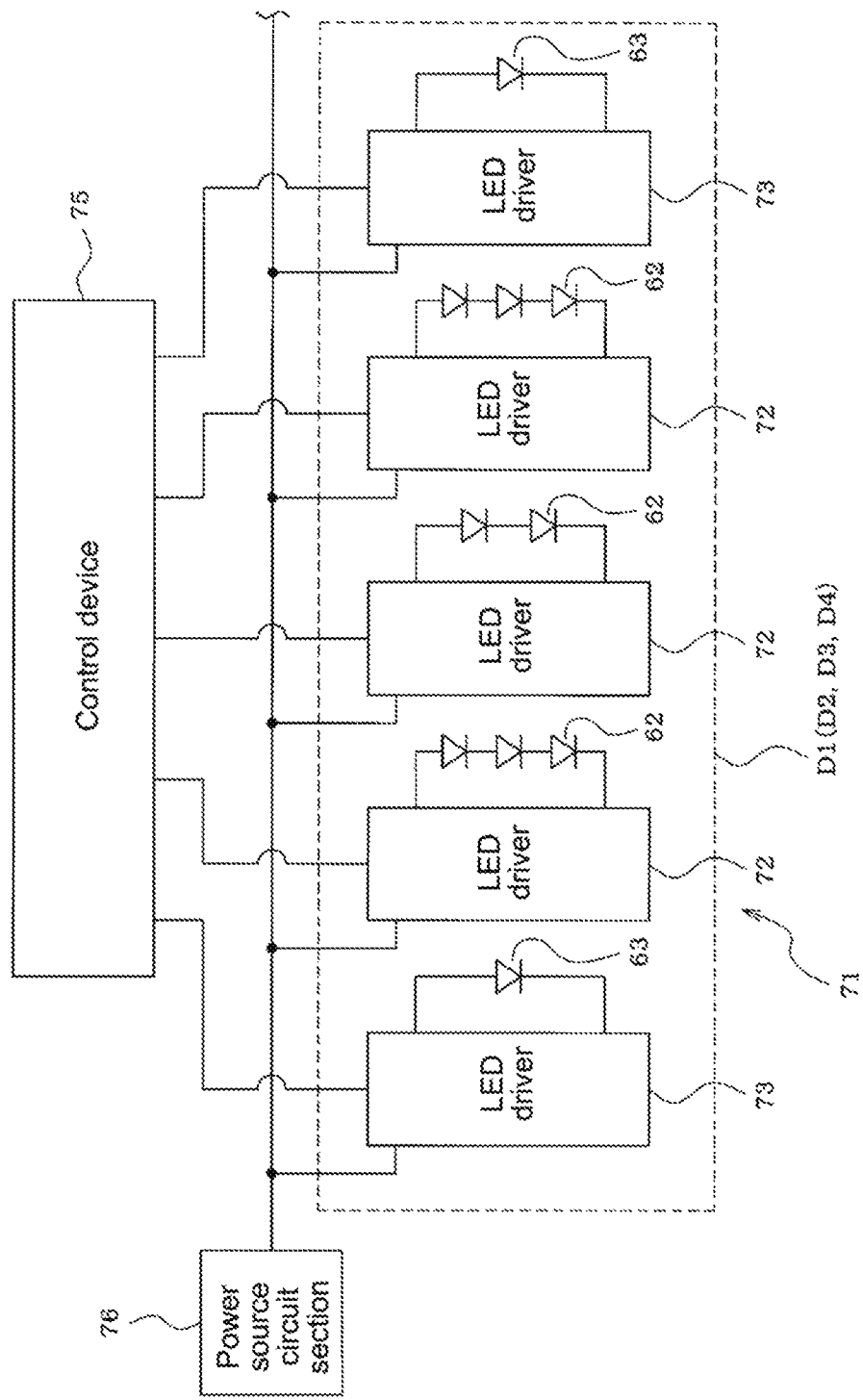
FIG. 6 is a block diagram showing the electrical configuration of the LED lighting device and the illumination light amount adjusting device.

The illumination light amounts of the illumination light output areas D1 to D4 of LED lighting device 61 configured as described above are adjusted in steps with a specified gradation quantity (for example, 64-step, 128-step, or the like) by illumination light amount adjusting device 71 shown in FIG. 6. Illumination light amount adjusting device 71 functions as a first adjusting unit that causes LED driver 73 (LED drive circuit) to flow a predetermined current to high-brightness LED element 63 to maintain an illumination light amount of a specified level, and also functions as a second adjusting unit that causes LED driver 72 (LED drive circuit) to flow a specified current to low-brightness LED element 62 to maintain an illumination light amount of a specified level.

The two high-brightness LED elements 63 in illumination light output areas D1 to D4 are driven by one or multiple LED drivers 73, and a specified constant current is flowed through the high-brightness LED elements 63 to irradiate the respective imaging targets with illumination light amounts of a specified level from the respective high-brightness LED elements 63. Here, the illumination light amount of the specified level may be an illumination light amount having a minimum required light amount level or a light amount level slightly lower than the minimum required light amount level for imaging the imaging target.

Since LED driver 73 for driving the high-brightness LED element 63 needs to supply a relatively large constant current to high-brightness LED element 63, when the output current value is insufficient using only one LED driver 73, one high-brightness LED element 63 may be driven by two LED drivers 73. Conversely, when there is a surplus in the output current value of the LED driver 73, two high-brightness LED elements 63 may be connected in series by a wiring pattern, not shown, and driven by one LED driver 73. Alternatively, high-brightness LED elements 63 of all the illumination light output areas D1 to D4 may be individually driven for each of the illumination light output areas D1 to D4 by one multi-channel output type LED driver 73. In either case, the LED driver 73 for driving the high-brightness LED element 63 may use an LED driver whose output current value cannot be adjusted, or, of course, an LED driver whose output current value can be adjusted may be used, but in this case, it is not necessary to adjust the output current value with the same gradation quantity as low-brightness LED element 62, and an inexpensive LED driver having a low gradation may be used. Note that, FIG. 6 shows a configuration example in which the two high-brightness LED elements 63 of the illumination light output areas D1 to D4 are driven by separate LED drivers 73.

On the other hand, the eight low-brightness LED elements 62 in the illumination light output areas D1 to D4 are divided into two or more groups, for example, three groups. In the present embodiment, low-brightness LED elements 62 are divided into two groups of three and one group of two low-brightness LED elements 62, and three or two low-brightness LED elements 62 of each group are connected in series by a wiring pattern, not shown, and are individually driven by one or multiple LED drivers 72. When the quantity of low-brightness LED elements 62 in each of the illumination light output areas D1 to D4 is large, the low-brightness LED elements 62 may be divided into four or more groups. Further, in a case in which all the low-brightness LED elements 62 of each illumination light output area D1 to D4 can be driven by one LED driver 72, all the low-brightness LED elements 62 of the illumination light output areas D1 to D4 may be driven by one LED driver 72 without dividing the low-brightness LED elements 62 into two or more groups. Alternatively, low-brightness LED elements 62 of all the illumination light output areas D1 to D4 may be individually driven for each of the illumination light output areas D1 to D4 by one multi-channel output type LED driver 72. Note that, the example configuration of FIG. 6 shows three or two low luminance LED elements 62 of each group being driven by separate LED drivers 72.

This LED driver 72 for driving low-brightness LED element 62 adjusts the current value of the constant current flowing through the low-brightness LED element 62 in steps with a specified gradation quantity (for example, 64 steps, 128 steps, and so on) so as to adjust the light emission amount of the low-brightness LED element 62 in steps with a specified gradation quantity, Illumination light amount adjusting device 71 for adjusting the illumination light amount of each of the illumination light output areas D1 to D4 of LED lighting device 61 is configured by control device 75 of component-mounting machine 10 and two types of LED drivers, 72 and 73, which are controlled by control device 75, and converts the current supplied from power source circuit section 76 into specified constant current at each of the LED drivers 72 and 73, and LED driver 72 for driving the low-brightness LED element 62 adjusts the current value of the constant current flowing through low-brightness LED element 62 in steps with a specified gradation quantity based on the illumination control signal from control device 75 of component-mounting machine 10, so as to adjust the light emission amount of the low-brightness LED element 62 in steps with a specified gradation quantity.

Figure 5:
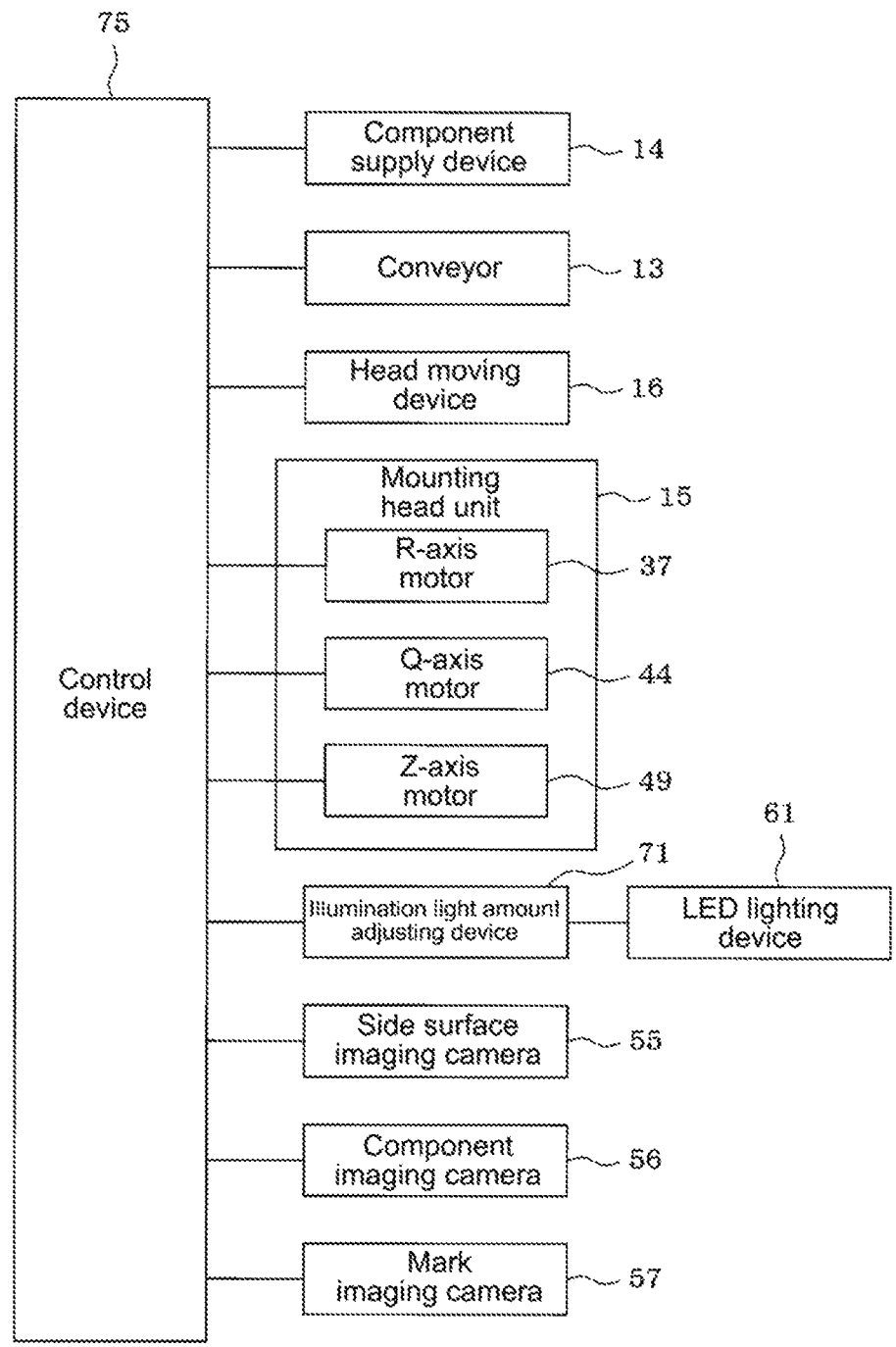
FIG. 5 is a block diagram showing the configuration of the control system of component-mounting machine.

Control device 75 of component-mounting machine 10 is configured by one or multiple computers (one or multiple CPUs), and controls the operation of each function (see FIG. 5) of component-mounting machine 10, and also functions as an imaging processing device that processes an image captured by mark imaging camera 56, component imaging camera 57, and side surface imaging camera 55 to recognize each imaging target. Specifically, control device 75 of the component-mounting machine uses mark imaging camera 56 to perform imaging from above of a reference mark, which is an imaging target, of circuit board 12 conveyed to a specified work position and clamped by conveyor 13, recognizes the reference mark, measures the respective component mounting positions of the circuit board 12 with reference to the position of the reference mark, then moves mounting head unit 15 in order to the following positions: component pickup position component imaging position component mounting position, during which a component supplied from component supply device 14 is picked up by suction nozzle 33 of mounting head unit 15, the electronic component is imaged by component imaging camera 57, the captured image is processed to measure the pickup position (X, Y) and the angle θ of the component, the deviation of the pickup position (X, Y) and the angle θ of the component are corrected, and the component is mounted on the circuit board 12.

Further, control device 75 of component-mounting machine 10, taking at least the lower end portions of the two suction nozzles 33 (B, C) located on both sides of the suction nozzle 33 (A) that is lowered for component pickup or mounting operation or the component being held by those suction nozzles, as an imaging target, illuminates the imaging target from the side using LED lighting device 61, and in a state with that illumination light amount adjusted by LED drives 72 and 73 of illumination light amount adjustment device 71, uses side surface imaging camera 55 to capture an image of a side surface of the imaging target, processes the side surface image, and checks for the presence or absence of the component being held by the two suction nozzles 33 (B, C).

Figure 7:
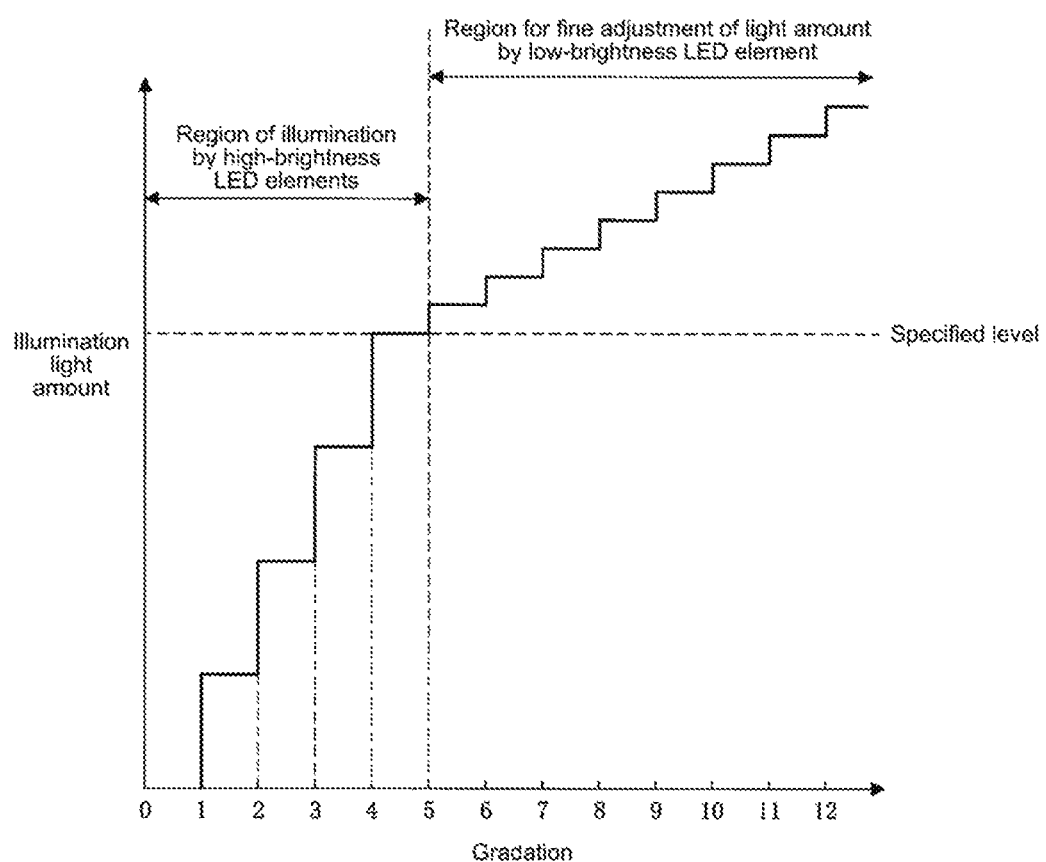
FIG. 7 illustrates the relationship between the illumination light amount of the LED lighting device and the adjustable gradation.

FIG. 7 illustrates the relationship between the illumination light amount of LED lighting device 61 of the present embodiment and the adjustable gradation by LED drivers 72 and 73 of illumination light amount adjusting device 71. In the example of FIG. 7, the range of the first gradation to the fourth gradation is a region to be adjusted by LED driver 73 for driving high-brightness LED element 63, and the illumination light amount of the high-brightness LED element 63 can be adjusted in four levels (four gradations). The illumination light amount of high-brightness LED element 63 when the high-brightness LED element 63 is driven at the fourth gradation in FIG. 7 is set so as to be the illumination light amount of the light amount level which is a minimum required for imaging of the imaging target or an illumination light amount level that is slightly lower than this. The range of the fifth gradation to the maximum gradation in FIG. 7 is a region to be adjusted by LED driver 72 for driving low-brightness LED element 62, and the illumination light amount of the low-brightness LED element 62 can be finely adjusted by a predetermined specified gradation quantity. Accordingly, by adjusting the current value of the constant current flowing through low-brightness LED element 62 in step with a specified gradation quantity so as to adjust the light emission amount of low-brightness LED element 62 in steps with a specified gradation quantity while causing a specified constant current flow through high-brightness LED element 63 to maintain an illumination light amount of a specified level, the illumination light amount can be adjusted in steps with a specified gradation quantity in a region exceeding the specified level while maintaining the illumination light amount required for imaging of the imaging target.

Note that, in a case in which high-brightness LED element 63 is driven at the fourth gradation in FIG. 7 and the illumination light amount of high-brightness LED element 63 exceeds the minimum light amount level required for imaging of the imaging target, a gradation may be selected from the third to first gradations of FIG. 7 such that the illumination light amount of the high-brightness LED element 63 becomes the minimum light amount level necessary for imaging of the imaging target or an illumination light amount slightly lower than that.

Generally, the amount of illumination light suitable for imaging an imaging target depends on the type of the imaging target, the performance of the camera, and the like, but in any case, it does not matter how finely the amount of illumination light amount can be adjusted in an area equal to or less than the minimum amount of light required for imaging the imaging target, meaning there is no need to adjust the amount of light.

Therefore, in the present embodiment, LED lighting device 61 is configured using two types of LED elements, 62 and 63, for which the brightness levels differ, and a specified level of illumination light amount is maintained (for example, a light amount level that is the minimum required for imaging of the imaging target, or a light amount level slightly lower than that) by making a specified current flow through the high-brightness LED elements 63, and the current flowing through the low-brightness LED elements 62 is adjusted in steps with the specified gradation, such that the illumination light amount is adjusted in the specified gradation quantity in a region that exceeds the specified level while the illumination light amount required for imaging the imaging target is maintained. In this manner, since the illumination light amount can be adjusted by the specified gradation quantity in a region exceeding the specified level that is a region for which light amount adjustment is required, the illumination light amount can be finely adjusted in a region in which the light amount adjustment is necessary, and the imaging target can be illuminated with an appropriate light amount. Further, by using high-brightness LED elements 63, the illumination light amount can be easily increased without increasing the quantity of LED elements 62, and increases in the illumination light amount can be handled while satisfying the demand to make the device compact.

Further, it is unnecessary to adjust the constant current flowing to high-brightness LED element 63 (at least, it is unnecessary to adjust by the gradation quantity as with low-brightness LED elements 62), and it is unnecessary to configure the LED driver 73 for adjusting the constant current flowing to the low-brightness LED element 62 by using a high-gradation LED driver, and moreover, it is possible to drive the multiple low-brightness LED elements 62 with a small quantity of LED drivers 72, making it possible to satisfy the requirements of a simple circuit configuration and low cost.

Further, in the present embodiment, since the multiple low-brightness LED elements 62 of each of the illumination light output areas D1 to D4 facing each imaging target are divided into two or more groups and the low-brightness LED elements 62 of each group are individually driven for each group by LED driver 72, the current value of the constant current to be individually flowed to the low-brightness LED elements 62 for each group can be adjusted in steps with a specified gradation quantity. As a result, the illumination light amount of low-brightness LED elements 62 in each of the illumination light output areas D1 to D4 can be adjusted more finely.

In addition, in the present embodiment, since the low-brightness LED elements 62 are arranged at a center section of each of the illumination light output areas D1 to D4 facing each imaging target, and high-brightness LED element 63 is arranged on both sides thereof, it is possible to finely adjust the amount of illumination light for illuminating each imaging target by the illumination light of the low-brightness LED elements 62 at the center section while uniformly illuminating each imaging target from an angle in both side directions by the illumination light of high-brightness LED elements 63 on both sides of each of the illumination light output areas D1 to D4, making it possible to create an illumination state suitable for imaging each imaging target.

Note that, in the present embodiment, since the four illumination light output areas D1 to D4 for illuminating the four imaging targets are integrally formed by one LED board 64 (flexible printed board), the number of components and the number of assembly steps can be reduced, but the LED board may be divided into four so that one illumination light output area is provided on each LED board. Also, the LED board is not limited to a flexible printed board, and may be formed of a rigid printed board which is not flexible.

Further, in the present embodiment, Z-axis drive mechanisms 48 for individually lowering nozzle holder 32 are provided at two positions in a diameter direction of rotation head 31, but the quantity and positions of Z-axis drive mechanisms 48 may be appropriately changed, for example, Z-axis drive mechanisms 48 may be provided at four positions (positions of 0°, 90°, 180°, and 270°) around rotation head 31, or, of course, Z-axis drive mechanism 48 may be provided at only one position.

Also, mounting head unit 15 is not limited to a configuration using rotation head 31, and may be a configuration using a mounting head that does not rotate.

In addition, in the present embodiment, a configuration has been described in which the illumination light amount of LED lighting device 61 of side surface imaging camera 55 for capturing a side image of a component held by nozzle 33 is adjusted in steps with a specified gradation quantity, but the LED lighting device of component imaging camera 57 for capturing an image of a component held by suction nozzle 33 from below and the LED lighting device of mark imaging camera 56 for capturing an image of a reference position mark of circuit board 12 may also be configured using two types of LED elements having different brightnesses, and a specified current value flowing to the low-brightness LED elements may be adjusted in steps with a specified gradation quantity while maintaining a specified level of illumination light amount (for example, a light amount level that is the minimum required for imaging of the imaging target, or a light amount level slightly lower than that) by making a specified current flow through the high-brightness LED elements.

Also, in the present embodiment, the light emission amount of low-brightness LED elements 62 is adjusted in steps with a specified gradation quantity by adjusting the current value flowing through the low-brightness LED elements 62 in steps with a specified gradation using a variable current-type LED driver 72, but the light emission amount of low-brightness LED elements 62 may be adjusted in steps with a specified gradation quantity via PWM control of a pulse width of a current flowing through low-brightness LED element 62 using a PWM adjustable-type LED driver.

Note that, the present disclosure is not limited to the above embodiments, and various changes may be made without departing from the scope, such as, for example, the arrangement and quantity of low-brightness LED elements 62 or high-brightness LED elements 63 may be changed appropriately, or the configuration of mounting head unit 15 or component-mounting machine 10 may be changed appropriately, and the like.

REFERENCE SIGNS LIST

10: component mounting machine;
12: circuit board;
13: conveyor;
14: component supply device;
15: mounting head unit;
16: head moving device;
31: rotation head;
32: nozzle holder;
33: suction nozzle;
34: R axis;
35: R-axis drive mechanism;
40: Q-axis drive mechanism;
48: Z-axis drive mechanism;
55: side surface imaging camera;
56: mark imaging camera;
57: component imaging camera;
61: LED lighting device;
62: low-brightness LED element;
63: high-brightness LED element;
64: LED board;
66: optical unit;
67a, 67b, 67c: mirror;
68a, 68b: prism;
71: illumination light amount adjusting device;
72, 73: LED driver;
75: control device

The invention claimed is:

1. A component-mounting machine comprising:
a rotary-type mounting head configured to hold multiple suction nozzles at a specified interval in a circumferential direction;
an LED lighting device configured to illuminate an imaging target that is to be imaged by a camera loaded on the component-mounting machine, the camera including an optical unit for imaging, at either a single or multiple locations of rotation positions of the mounting head, from a respective side, at least a lower end portion of two of the suction nozzles or a component being held by the respective suction nozzles as the imaging target, the two suction nozzles being adjacent to a suction nozzle that is lowered during component pickup or component mounting operation among the multiple suction nozzles, the LED lighting device provided with two types of LED elements with different brightness levels in each of multiple illumination light output areas, the multiple illumination light output areas being provided so as to illuminate from respective sides at least the lower end portion of the two suction nozzles, or the component held by the suction nozzles, positioned adjacent to the suction nozzle that is lowered to perform component pickup or mounting operation, at a single or multiple locations of the rotation positions of the mounting head; and
an illumination light amount adjusting device configured to adjust in steps with a specified gradation quantity an illumination light amount of the LED lighting device, the illumination light amount adjusting device including
a first adjusting section configured to maintain a specified level of illumination light amount by making a specified current flow through high-brightness LED elements that are the LED elements with a higher brightness level out of the two types of LED elements, and
a second adjusting section configured to maintain a specified level of illumination light amount by making a specified current flow through low-brightness LED elements that are the LED elements with a lower brightness level out of the two types of LED elements.

2. A component-mounting machine comprising:
a rotary-type mounting head configured to hold multiple suction nozzles at a specified interval in a circumferential direction;
an LED lighting device configured to illuminate an imaging target that is to be imaged by a camera loaded on the component-mounting machine, the camera including an optical unit for imaging, at either a single or multiple locations of rotation positions of the mounting head, from a respective side, at least a lower end portion of two of the suction nozzles or a component being held by the respective suction nozzles as the imaging target, the two suction nozzles being adjacent to a suction nozzle that is lowered during component pickup or component mounting operation among the multiple suction nozzles, the LED lighting device provided with two types of LED elements with different brightness levels in each of multiple illumination light output areas, the multiple illumination light output areas being provided so as to illuminate from respective sides at least the lower end portion of the two suction nozzles, or the component held by the suction nozzles, positioned adjacent to the suction nozzle that is lowered to perform component pickup or mounting operation, at a single or multiple locations of the rotation positions of the mounting head; and
an illumination light amount adjusting device configured to adjust in steps with a specified gradation quantity an illumination light amount of the LED lighting device, the LED lighting device including two types of LED elements with different brightness levels, and the illumination light amount adjusting device is configured to adjust in steps with a specified gradation quantity a pulse width or a current value of a current flowing through low-brightness LED elements that are the LED elements with a lower brightness level out of the two types of LED elements so as to adjust in steps with a specified gradation quantity an emitted light amount of the low-brightness LED elements while maintaining a specified level of illumination light amount by making a specified current flow through high-brightness LED elements that are the LED elements with a higher brightness level out of the two types of LED elements, in order to adjust the illumination light amount in steps with the specified gradation quantity in a region that exceeds the specified level while maintaining a required illumination light amount required for imaging the imaging target.

3. The component-mounting machine according to claim 1, wherein
a quantity of the low-brightness LED elements is greater than a quantity of the high-brightness LED elements.

4. The component-mounting machine according to claim 1, wherein
multiple of the low-brightness LED elements are provided, and
the illumination light amount adjusting device divides the multiple the low-brightness LED elements into two or more groups, and individually adjusts the pulse width or current value of the current flowing through the low-brightness LED elements for each group in steps with the specified gradation quantity.

5. The component-mounting machine according to claim 1, wherein
the LED lighting device has multiple of the low-brightness LED elements arranged at a central side of an illumination light outputting area facing the imaging target, and at least one of the high-brightness LED elements arranged at both sides of the low-brightness LED elements.

6. The component-mounting machine according to claim 1, wherein
the illumination light amount adjusting device is configured to be able to adjust in steps the pulse width or the current value of the current flowing through the high-brightness LED elements.

7. An illumination light amount adjustment method for a component-mounting machine including a rotary-type mounting head configured to hold multiple suction nozzles at a specified interval in a circumferential direction; an LED lighting device configured to illuminate an imaging target that is to be imaged by a camera loaded on the component-mounting machine, the camera including an optical unit for imaging, at either a single or multiple locations of rotation positions of the mounting head, from a respective side, at least a lower end portion of two of the suction nozzles or a component being held by the respective suction nozzles as the imaging target, the two suction nozzles being adjacent to a suction nozzle that is lowered during component pickup or component mounting operation among the multiple suction nozzles, the LED lighting device provided with two types of LED elements with different brightness levels in each of multiple illumination light output areas, the multiple illumination light output areas being provided so as to illuminate from respective sides at least the lower end portion of the two suction nozzles, or the component held by the suction nozzles, positioned adjacent to the suction nozzle that is lowered to perform component pickup or mounting operation, at a single or multiple locations of the rotation positions of the mounting head; and an illumination light amount adjusting device configured to adjust in steps with a specified gradation quantity an illumination light amount of the LED lighting device, the LED lighting device is provided with two types of LED elements with different brightness levels, the method comprising:
a first adjusting process of maintaining a specified level of illumination light amount by making a specified current flow through high-brightness LED elements that are the LED elements with a higher brightness level out of the two types of LED elements, and
a second adjusting process of maintaining a specified level of illumination light amount by making a specified current flow through low-brightness LED elements that are the LED elements with a lower brightness level out of the two types of LED elements.

* * * * *